United States Patent
Sun et al.

(10) Patent No.: US 12,183,818 B2
(45) Date of Patent: Dec. 31, 2024

(54) POWER SEMICONDUCTOR DEVICE AND MANUFACTURING METHOD THEREFOR

(71) Applicants: SOUTHEAST UNIVERSITY, Nanjing (CN); CSMC TECHNOLOGIES FAB2 CO., LTD., Wuxi (CN)

(72) Inventors: Weifeng Sun, Wuxi (CN); Rongcheng Lou, Wuxi (CN); Kui Xiao, Wuxi (CN); Feng Lin, Wuxi (CN); Jiaxing Wei, Wuxi (CN); Sheng Li, Wuxi (CN); Siyang Liu, Wuxi (CN); Shengli Lu, Wuxi (CN); Longxing Shi, Wuxi (CN)

(73) Assignees: SOUTHEAST UNIVERSITY; CSMC TECHNOLOGIES FAB2 CO., LTD.

( * ) Notice: Subject to any disclaimer, the term of this patent is extended or adjusted under 35 U.S.C. 154(b) by 862 days.

(21) Appl. No.: 17/417,677

(22) PCT Filed: Dec. 23, 2019

(86) PCT No.: PCT/CN2019/127355
§ 371 (c)(1),
(2) Date: Jun. 23, 2021

(87) PCT Pub. No.: WO2020/135313
PCT Pub. Date: Jul. 2, 2020

(65) Prior Publication Data
US 2022/0115532 A1 Apr. 14, 2022

(30) Foreign Application Priority Data

Dec. 24, 2018 (CN) .......................... 201811583692.1

(51) Int. Cl.
*H01L 29/78* (2006.01)
*H01L 21/04* (2006.01)
(Continued)

(52) U.S. Cl.
CPC ...... *H01L 29/7806* (2013.01); *H01L 21/0465* (2013.01); *H01L 29/1095* (2013.01); *H01L 29/1608* (2013.01); *H01L 29/66068* (2013.01)

(58) Field of Classification Search
CPC ............ H01L 29/7806; H01L 21/0465; H01L 29/1095
See application file for complete search history.

(56) References Cited

U.S. PATENT DOCUMENTS

| 7,863,685 B2 | 1/2011 | Hshieh |
| 8,704,295 B1 | 4/2014 | Darwish et al. |

(Continued)

FOREIGN PATENT DOCUMENTS

| CN | 101853852 A | 10/2010 |
| CN | 101950759 A | 1/2011 |

(Continued)

OTHER PUBLICATIONS

Extended European Search Report for corresponding European Application No. 19904844.8, dated Aug. 8, 2022, 10 pages.
(Continued)

*Primary Examiner* — Errol V Fernandes
(74) *Attorney, Agent, or Firm* — Dority & Manning, P.A.

(57) ABSTRACT

A power semiconductor device includes: a substrate; drain metal; a drift region; a base region; a gate structure; a first conductive type doped region contacting the base region on the side of the base region distant from the gate structure; a source region provided in the base region and between the first conductive type doped region and the gate structure; contact metal that is provided on the first conductive type doped region and forms a contact barrier having rectifying characteristics together with the first conductive type doped region below; and source metal wrapping the contact metal and contacting the source region.

20 Claims, 6 Drawing Sheets

(51) Int. Cl.
　　　*H01L 29/10*　　　(2006.01)
　　　*H01L 29/16*　　　(2006.01)
　　　*H01L 29/66*　　　(2006.01)

(56) References Cited

U.S. PATENT DOCUMENTS

| | | | |
|---|---|---|---|
| 10,256,294 B2 * | 4/2019 | Pilla | H01L 29/205 |
| 11,158,708 B1 * | 10/2021 | Sun | H01L 29/1608 |
| 2004/0262678 A1 | 12/2004 | Nakazawa et al. | |
| 2011/0156810 A1 | 6/2011 | Girdhar et al. | |
| 2014/0151790 A1 | 6/2014 | Lui et al. | |
| 2014/0231827 A1 | 8/2014 | Watanabe et al. | |
| 2015/0084066 A1 * | 3/2015 | Banerjee | H01L 29/8083 |
| | | | 257/77 |
| 2015/0236012 A1 | 8/2015 | Hino et al. | |
| 2016/0233210 A1 | 8/2016 | Matocha et al. | |
| 2017/0263763 A1 | 9/2017 | Ryu et al. | |

FOREIGN PATENT DOCUMENTS

| | | |
|---|---|---|
| CN | 102044563 | 5/2011 |
| CN | 104617139 | 5/2015 |
| CN | 105226058 | 1/2016 |
| CN | 105762176 A | 7/2016 |
| CN | 105810722 A | 7/2016 |
| CN | 106663699 | 5/2017 |
| CN | 107425046 | 12/2017 |
| CN | 108257856 A | 7/2018 |
| CN | 108807505 A | 11/2018 |
| CN | 109979801 | 7/2019 |
| JP | 2003017701 A | 1/2003 |

OTHER PUBLICATIONS

Japanese Office Action (w/ English machine translation) for corresponding JP Application No. 2021-536814, drafted Jun. 24, 2022, 10 pages.
PCT International Search Report and Written Opinion (with English translation) for corresponding PCT Application No. PCT/CN2021/101751, mailed Sep. 26, 2021, 13 pages.
PCT International Search Report (w/ English Translation) and Written Opinion for corresponding PCT Application No. PCT/CN2019/127355, mailed on Mar. 25, 2020, 8 pages.

* cited by examiner

POWER SEMICONDUCTOR DEVICE AND MANUFACTURING METHOD THEREFOR

CROSS-REFERENCE TO RELATED APPLICATIONS

This application is a national phase application of International Patent Application No. PCT/CN2019/127355, filed Dec. 23, 2019, which, in turn, claims priority to Chinese Patent Application No. 201811583692.1, filed Dec. 24, 2018, the entire contents of both of which are hereby incorporated herein by reference.

TECHNICAL FIELD

The present disclosure relates to semiconductor devices, more particularly, to a power semiconductor device and a manufacturing method thereof.

BACKGROUND

Silicon carbide is one of the wide band gap semiconductor materials developed rapidly in recent decades. Compared with silicon, germanium and gallium arsenide which are widely used semiconductor materials, silicon carbide has many advantages, such as a wide band gap, a high breakdown electric field, a high carrier saturation drift rate, high thermal conductivity and high power density, and thus is an ideal material for preparing high-temperature, high-power and high-frequency devices. At present, developed countries such as the United States, Europe and Japan have basically solved the problems of single-crystal growth and homoepitaxial films of silicon carbide, and occupy a leading position in the field of high-power semiconductor devices.

In current industrial applications, conventional silicon carbide power devices are used in conjunction with a freewheel diode due to operation requirements. A parasitic body diodes inside a conventional silicon carbide device has a high conduction voltage drop, and thus it is often necessary to use a diode in parallel on its outside. However, since the diode is outside the conventional power device, this is less integrated, more expensive and less efficient.

SUMMARY

Accordingly, it is necessary to provide a power semiconductor device having a body diode with good forward conduction capability and a manufacturing method thereof.

A power semiconductor device includes: a substrate of a first conductivity type; a drain metal disposed on a first surface of the substrate; a drift region of the first conductivity type and disposed on a second surface of the substrate, the second surface being opposite to the first surface; a base region of a second conductivity type and disposed in the drift region; the first conductivity type and the second conductivity type being opposite conductivity types; a gate structure including a gate dielectric layer on the drift region and a gate on the gate dielectric layer, the gate structure extending above the base region; a first-conductivity-type doping region in contact with the base region on one side of the base region away from the gate structure; a source region of the first conductivity type and disposed in the base region and between the first-conductivity-type doping region and the gate structure; a contact metal disposed on the first-conductivity-type doping region and forming a contact barrier having rectification characteristics with the first-conductivity-type doping region below, wherein a dimension of the contact metal in a first direction is greater than a dimension of the first-conductivity-type doping region in the first direction, such that the contact metal extends to a position above the base region next to the first-conductivity-type doping region and not reaching the source region, the first direction being a wiring direction between the gate and the contact metal; and a source metal wrapping the contact metal and in contact with the source region.

A method of manufacturing a power semiconductor device includes: acquiring a substrate provided with a drift region, the drift region being formed on one surface of the substrate, and the substrate and the drift region being of a first conductivity type; doping second-conductivity-type ions to form a base region of a second conductivity type in the drift region; the first conductivity type and the second conductivity type being opposite conductivity types; doping first-conductivity-type ions to form a first-conductivity-type doping region in the drift region that is in contact with the base region; doping the first-conductivity-type ions to form a source region of the first conductivity type in the base region; forming a contact metal on the first-conductivity-type doping region, the contact metal forming a contact barrier having rectification characteristics with the first-conductivity-type doping region below, and the contact metal extending toward the source region and above the base region not reaching the source region; forming a gate structure on the drift region, the gate structure including a gate dielectric layer on the drift region and a gate on the gate dielectric layer, the gate structure extending above one side of the base region opposite to the first-conductivity-type doping region; and forming a source metal wrapping the contact metal, the source metal being in contact with the source region.

According to the foregoing power semiconductor device and the manufacturing method, the contact metal of the contact barrier having rectification characteristics is introduced to the bottom of the source metal, meanwhile the first-conductivity-type doping region is added below the contact metal, which replaces the parasitic body diode in the conventional power device to complete a freewheel function. A freewheel conduction voltage drop is obviously reduced, and a reverse recovery speed of the device is faster than that of the parasitic body diode of the conventional power device. Besides, a reverse recovery peak current of the improved structure is lower than that of the parasitic body diode of the conventional power device, and its reliability is higher.

BRIEF DESCRIPTION OF THE DRAWINGS

In order to better describe and illustrate embodiments and/or examples of those applications disclosed herein, reference may be made to one or more accompanying drawings. Additional details or examples used to describe the accompanying drawings should not be considered as limitations on the scope of any of the disclosed applications, the presently described embodiments and/or examples, and the presently understood best mode of these applications.

DETAILED DESCRIPTION OF THE EMBODIMENTS

To facilitate the understanding of the present application, a more comprehensive description of the present application is given below with reference to the accompanying drawings. Preferred embodiments of the present application are given in the accompanying drawings. However, the present application may be implemented in many different forms and is not limited to the embodiments described herein. On the contrary, these embodiments are provided to understand the disclosed content of the present application more thoroughly and comprehensively.

Unless otherwise defined, all technical and scientific terms used herein have the same meaning as commonly understood by those of ordinary skill in the art to which the present application belongs. The terms used in the specification of the present application are intended only to describe particular embodiments and are not intended to limit the present application. The term "and/or" used herein includes any and all combinations of one or more of the associated listed items.

It should be understood that when an element or layer is referred to as being "on", "adjacent to", "connected to", or "coupled to" another element or layer, the element or layer may be directly on, adjacent to, connected to, or coupled to the another element or layer, or an intervening element or layer may be disposed therebetween. On the contrary, when an element is referred to as being "directly on", "directly adjacent to", "directly connected to", or "directly coupled to" another element or layer, no intervening element or layer may be disposed therebetween. It should be understood that although terms such as first, second, and third may be used to describe various elements, components, regions, layers and/or portions, the elements, components, regions, layers and/or portions may not be limited to such terms. Such terms are used only to distinguish one element, component, region, layer or portion from another element, component, region, layer or portion. Thus, without departing from the teaching of the present application, a first element, component, region, layer or portion may be referred to as a second element, component, region, layer or portion.

Spatial relationship terms such as "under", "underneath", "below", "beneath", "over", and "above" may be used for illustrative purposes to describe a relationship between one element or feature and another element or feature illustrated in the figures. It should be understood that, in addition to the orientations illustrated in the figures, the spatial relationship terms are intended to further include different orientations of the device in use and operation. For example, if the device in the figures is flipped, the element or feature described as "below", "underneath" "under" another element or feature may be oriented as "on" the another element or feature. Thus, the exemplary terms "below" and "under" may include two orientations of above and below. In addition, the device may include additional orientations (e.g., 90-degree rotation or other orientations), and thus spatial descriptors used herein may be interpreted accordingly.

The terms used herein are intended only to describe particular embodiments and are not limitations on the present application. In use, the singular forms of "a", "one", and "the" may also include plural forms, unless otherwise clearly specified by the context. It should be further understood that the terms "include/comprise" and/or "have" specify the presence of the features, integers, steps, operations, elements and/or components, but may not exclude the presence or addition of one or more of other features, integers, steps, operations, elements, components and/or groups. At the same time, in the specification, the term "and/or" may include any and all combinations of related listed items.

The embodiments of the present disclosure are described herein with reference to cross-sectional views of schematic diagrams of ideal embodiments (and intermediate structures) of the present application. Correspondingly, illustrated shape variations caused by, for example, manufacturing techniques and/or tolerances, may be expected. Thus, the embodiments of the present application may not be limited to the specific shapes of the regions illustrated herein, but may include shape deviations caused by, for example, the manufacturing techniques. For example, an implanted region illustrated as a rectangle, typically, has rounded or curved features and/or a gradient of implant concentration at its edges rather than a binary change from an implanted region to a non-implanted region. Likewise, a buried region formed by implantation may result in some implantation in the region between the buried region and a surface through which the implantation takes place. Thus, the regions shown in the figures are generally schematic, and their shapes are not intended to show the actual shape of the region of the device, and are not intended to limit the scope of the present application.

The semiconductor vocabularies used herein are technical terms commonly used by those skilled in the art. For example, with respect to P-type and N-type impurities, in order to distinguish the doping concentration, a P+ type simply represents a P type with heavily doped concentration, a P type represents a P type with medium doped concentration, and a P− type represents a P type with lightly doped concentration. An N+ type represents an N type with heavily doped concentration, an N type represents an N type with medium doped concentration, and an N− type represents an N type with lightly doped concentration.

Figure 1:
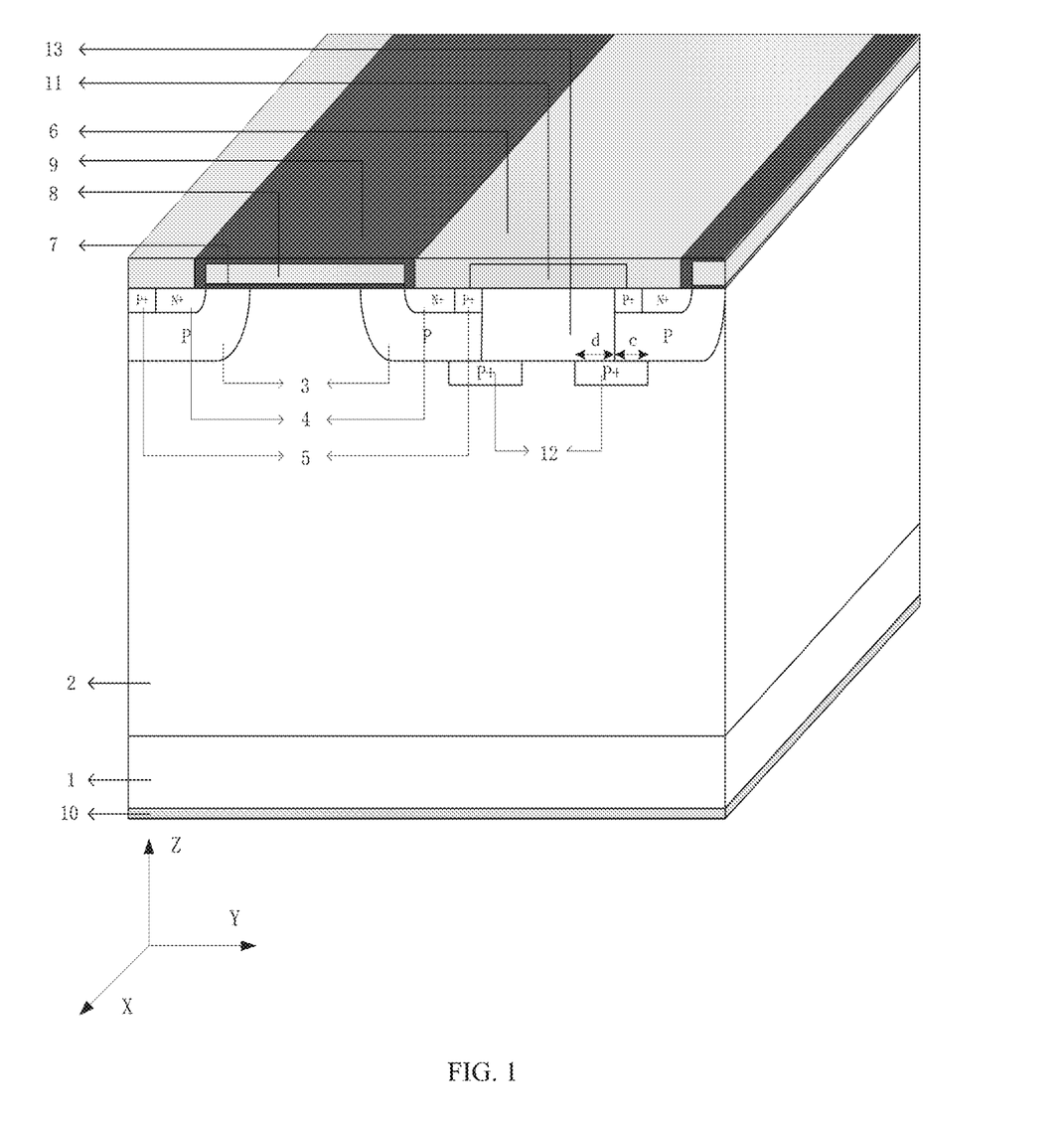
FIG. 1 is a perspective view of a power semiconductor device according to an embodiment.

FIG. 1 is a structural perspective view of a power semiconductor device according to an embodiment. The power semiconductor device includes a substrate 1, a drain metal 10, a drift region 2, a base region 3, a first-conductivity-type doping region 13, a source region 4, a contact metal 11, a source metal 6 and a gate structure (including a gate 8 and a gate dielectric layer 7). In the present embodiment, the power semiconductor device is a silicon carbide power semiconductor device, but the power semiconductor device of the present application are also applicable to power semiconductor devices made of other substrate materials.

The substrate 1 is a substrate of a first conductivity type. The drain metal 10 is disposed on a back surface of the substrate 1 (i.e., a downward surface in FIG. 1). The drift region 2 is a drift region of a second conductivity type and is disposed on a front surface of the substrate 1 (i.e., an upward surface in FIG. 1). In the embodiment shown in FIG. 1, the first conductivity type is N-type, the second conductivity type is P-type, the substrate 1 is an N-type substrate, and the drift region 2 is an N-type drift region. In another embodiment, the first conductivity type may be P-type and the second conductivity type may be N-type.

The base region 3 is disposed in the drift region 2. In the embodiment shown in FIG. 1, the base region 3 is a P-type base region. The gate dielectric layer 7 is disposed on the drift region 2, and the gate 8 is disposed on the gate dielectric layer 7. The source region 4 is an N+ source region in the embodiment shown in FIG. 1, and is disposed in the base region 3 and between the first-conductivity-type doping region 13 and the gate structure. The gate structure extends above the base region 3. In the embodiment shown in FIG. 1, both sides of the gate structure are each provided with a base region 3 and a source region 4, and the two base regions 3 (and the two source regions 4) are arranged in bilateral symmetry. In the embodiment shown in FIG. 1, the first-conductivity-type doping region 13 is an N-type doping region and is in contact with the base region 3 on one side of the base region 3 away from the gate structure.

The contact metal 11 is disposed on the first-conductivity-type doping region 13 and forms, with the first-conductivity-type doping region 13 below, a contact barrier having rectification characteristics, which may be, for example, a schottky barrier. In one embodiment, the contact metal 11 may be made of metals such as gold, titanium, and nickel, etc., which form a barrier having rectification characteristics after contacting a semiconductor.

In FIG. 1, a dimension of the contact metal 11 in a Y-axis direction is greater than that of the first-conductivity-type doping region 13 in the Y-axis direction, such that the contact metal 11 completely covers the first-conductivity-type doping region 13 and extends above the base region 3. The Y-axis direction in FIG. 1 is also a wiring direction between the gate 8 and the contact metal 11. In the embodiment shown in FIG. 1, the contact metal 11 is only slightly "wider" than the first-conductivity-type doping region 13, so as not to extend above the source region 4. The source metal 6 wraps the contact metal 11 and is in contact with the source region 4.

According to the foregoing power semiconductor device, the contact metal 11 of the contact barrier having rectification characteristics is introduced to the bottom of the source metal 6, meanwhile the first-conductivity-type doping region 13 is added below the contact metal 11, which replaces the parasitic body diode in the conventional power device to complete a freewheel function. A freewheel conduction voltage drop is obviously reduced, and a reverse recovery speed of the device is faster than that of the parasitic body diode of the conventional power device. Besides, a reverse recovery peak current of the improved structure is lower than that of the parasitic body diode of the conventional power device, and its reliability is higher.

In the embodiment shown in FIG. 1, the power semiconductor device further includes a body contact region 5 of the second conductivity type. The body contact region 5 is disposed in the base region 3 and between the source region 4 and the first-conductivity-type doping region 13, and the contact metal 11 is in contact with the body contact region 5. In the embodiment shown in FIG. 1, the body contact region 5 is a P+ contact region, the contact metal 11 extends along the Y-axis direction above the body contact region 5, and the source metal 6 is also in contact with the body contact region 5. In the embodiment shown in FIG. 1, both sides of the gate structure are each provided with one body contact region 5, and the two body contact regions 5 are arranged in bilateral symmetry. The first-conductivity-type doping region 13 is also provided with mutually symmetrical body contact regions 5 on both sides thereof.

In the embodiment shown in FIG. 1, the power semiconductor device further includes a passivation layer 9. The passivation layer 9 covers the gate structure and wraps both sides of the gate structure.

In one embodiment, the gate dielectric layer 7 may include conventional dielectric materials, such as silicon oxides, nitrides and nitrogen oxides with dielectric constants from about 4 to about 20 (measured in vacuum). Alternatively, the gate dielectric layer 7 may include dielectric materials with generally higher dielectric constants ranging from about 20 to at least about 100. Such dielectric materials with higher dielectric constants may include, but are not limited to, hafnium oxides, hafnium silicates, titanium oxides, barium strontium titanates (BSTs) and lead zirconate titanates (PZTs).

In one embodiment, the gate 8 is made of a polysilicon material. In other embodiments, the gate 8 may be made of metal, metal nitride, metal silicide or similar compounds.

In the embodiment shown in FIG. 1, the power semiconductor device further includes a second-conductivity-type doping region 12 disposed in the drift region 2. In the present embodiment, the second-conductivity-type doping region 12 is a P+ doping region. The second-conductivity-type doping region 12 is disposed below the base region 3 and the first-conductivity-type doping region 13 (i.e., a part of the second-conductivity-type doping region 12 is disposed below the base region 3, and a part thereof is disposed below the first-conductivity-type doping region 13), and is in contact with the base region 3 and the first-conductivity-type doping region 13.

Referring to FIG. 1, in one embodiment, a dimension ratio in the Y-axis direction of the part of the second-conductivity-type doping region 12 disposed below the base region 3 to the part disposed below the first-conductivity-type doping region 13 is 0.2-0.4:1, that is, c:d=0.2-0.4:1. It should be noted that the dimensions of c and d in FIG. 1 do not represent actual dimensions/proportions of the second-conductivity-type doping region 12.

The first-conductivity-type doping region 13 is introduced below the base region 3, and the second-conductivity-type doping region 12 extends below the first-conductivity-type doping region 13, such that when the power semiconductor device is subjected to a reverse withstand voltage, a depletion layer between the second-conductivity-type doping region 12 and the first-conductivity-type doping region 13 as well as the drift region 2 may be pinched off, thus restricting a large electric field outside the first-conductivity-type doping region 13. Therefore, the device can maintain a high reverse withstand voltage value.

Figure 2:
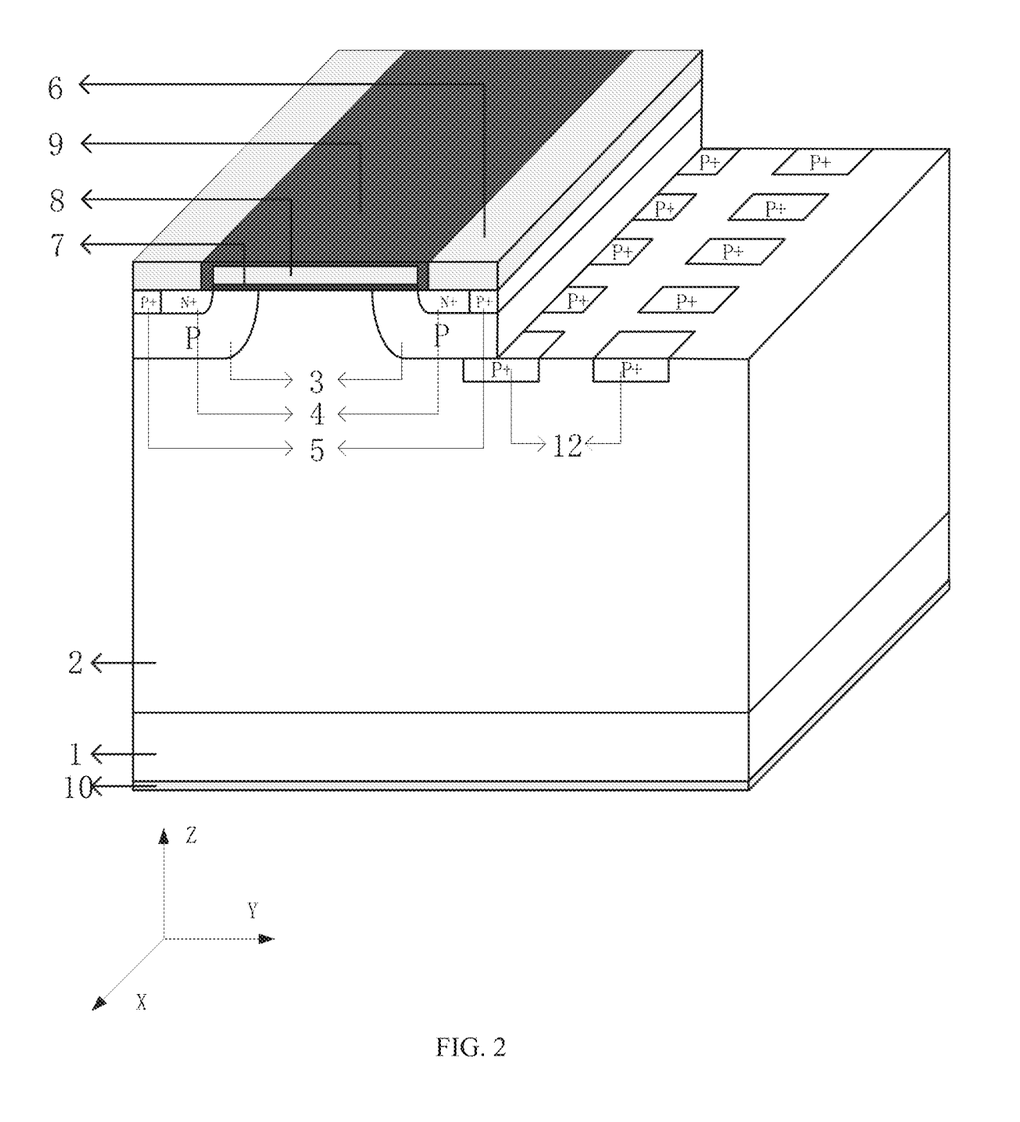
FIG. 2 is a partial cross-sectional perspective view of a power semiconductor device according to another embodiment.
Figure 3:
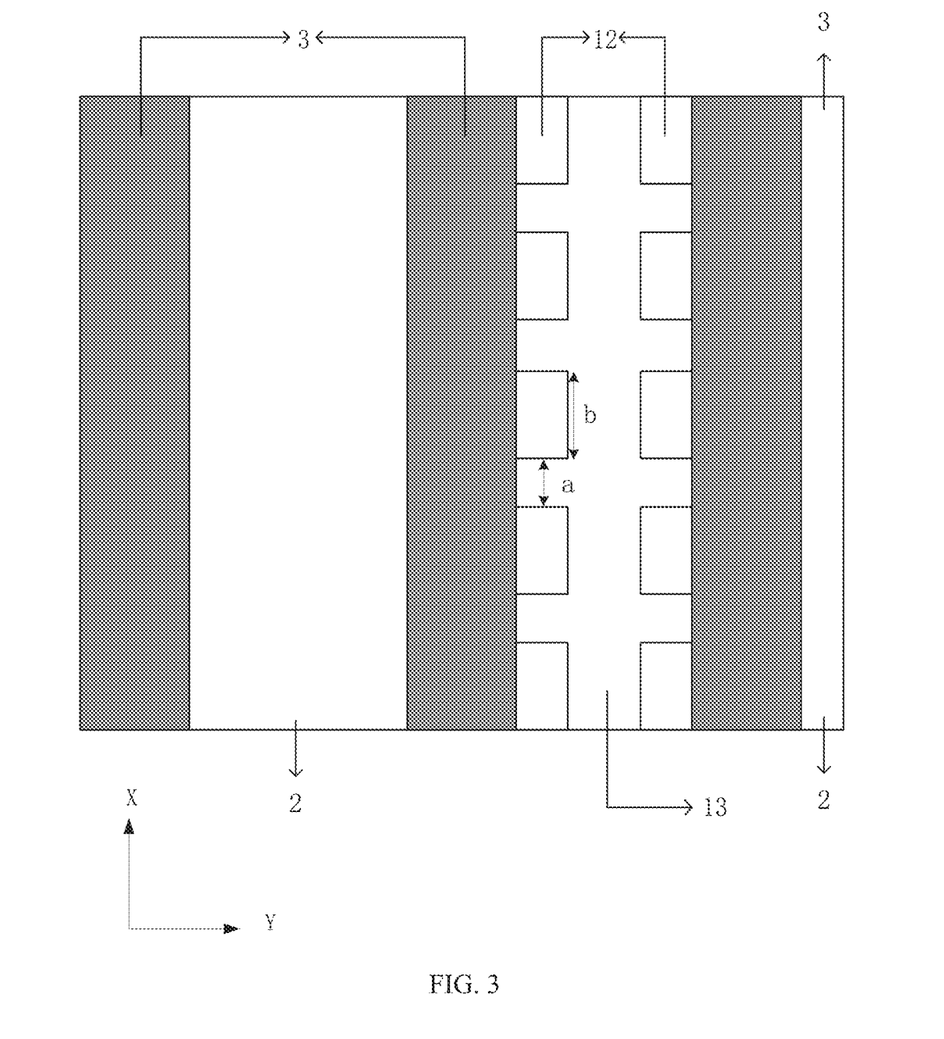
FIG. 3 is a top cross-sectional view along another section of the power semiconductor device shown in FIG. 2.

Referring to FIG. 2 and FIG. 3 together, the second-conductivity-type doping region 12 consists of a plurality of P+ sub-doping regions that are distributed at intervals in an X-axis direction. It should be understood that X and Y axes form a horizontal plane (the one and only plane that passes through two intersecting lines). In the embodiment, the P+ sub-doping regions are distributed at intervals below the base region 3 along a gate width direction (i.e., the X-axis direction in FIG. 2 and FIG. 3) in the power semiconductor device. When subjected to the reverse withstand voltage, a depletion layer between two adjacent P+ sub-doping regions is pinched off, which can achieve the reverse withstand voltage like the second-conductivity-type doping region 12 that is a device structure of a complete region. When the body diode conducts forward, a forward conduction area of the body diode is increased due to the presence of a region between each two adjacent P+ sub-doping regions in the gate width direction, thereby further enhancing freewheel conduction capability.

Referring to FIG. 3, in the embodiment, the P+ sub-doping regions are of equal size and distributed at equal intervals in the X-axis direction.

Referring to FIG. 3, in one embodiment, a ratio of a dimension a of the interval between the P+ sub-doping regions in the X-axis direction to a dimension b of the P+ sub-doping regions in the X-axis direction is 0.2-0.6:1. It should be noted that the dimensions of a and b in FIG. 3 do not represent actual dimensions/proportions of the P+ sub-doping regions.

In the embodiment shown in FIG. 1, a doping concentration of the first-conductivity-type doping region 13 is greater than that of the drift region 2 but less than that of the source region 4. In one embodiment, the first-conductivity-type doping region 13 is an N-type doping region, whose doping concentration is much lower than that of the N+ source region. The concentration of the region may be specifically adjusted according to device parameter requirements.

In one embodiment, doped ions in the second-conductivity-type doping region 12 are aluminum ions, doped ions in the base region 3 are aluminum ions, doped ions in the first-conductivity-type doping region 13 are nitrogen ions, doped ions in the body contact region 5 are aluminum ions, and doped ions in the source region 4 are nitrogen ions.

Since silicon carbide power devices are generally used in conjunction with freewheel diodes, the structure of the power semiconductor device described above is especially suitable for silicon carbide power devices. However, it should be understood by those skilled in the art that, the structure is also adapted for power devices made of other substrate materials, for example, power devices with a silicon substrate, a germanium substrate, a gallium arsenide substrate, and the like.

Figure 4:
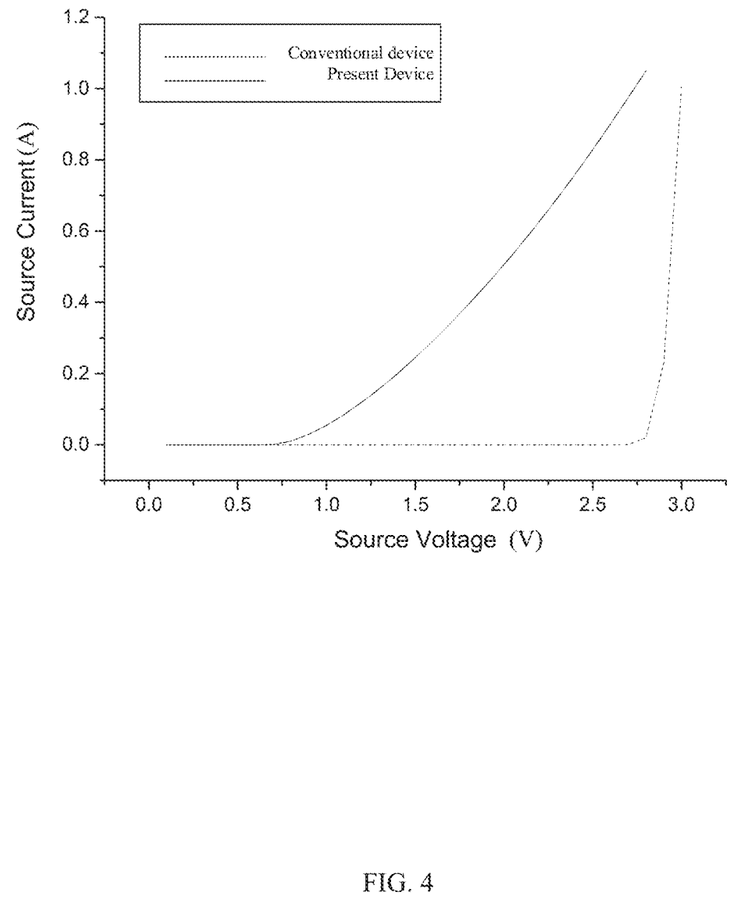
FIG. 4 is a graph of current of the device according to an embodiment of the present application vs. current of a conventional silicon carbide power semiconductor device when the gate-drain voltage is zero, and the source terminal voltage gradually increases.
Figure 5:
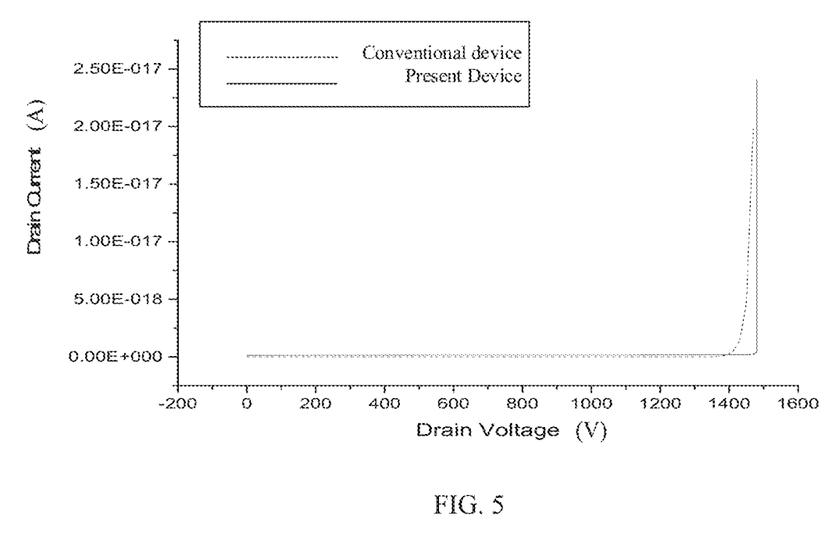
FIG. 5 is a graph of breakdown voltage of the device according to an embodiment of the present application vs. breakdown voltage of the conventional silicon carbide power semiconductor device.

FIG. 4 is a graph of current of the device according to an embodiment of the present application vs. current of a conventional silicon carbide power semiconductor device when the gate-drain voltage is zero, and the source terminal voltage gradually increases. It can be seen that a conduction voltage of the body diode of the device according to the present application is obviously lower than that of the conventional device. FIG. 5 is a graph of breakdown voltage of the device according to an embodiment of the present application vs. breakdown voltage of the conventional silicon carbide power semiconductor device. It can be seen that the breakdown voltage of the device according to the present application maintains at a high value.

Figure 6:
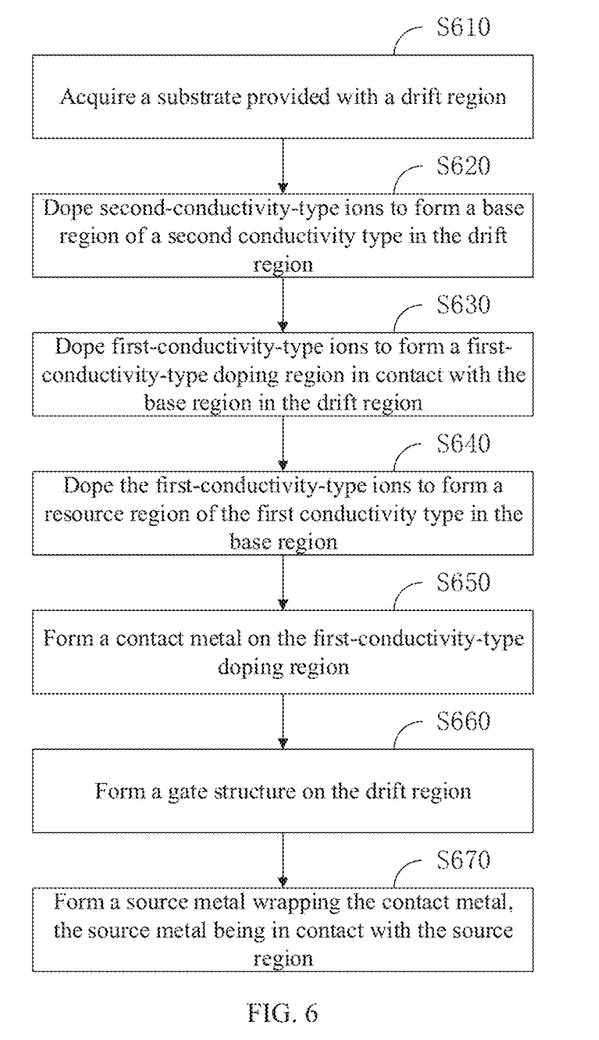
FIG. 6 is a flowchart of a manufacturing method of a power semiconductor device according to an embodiment.

The present disclosure further provides a method of manufacturing a power semiconductor device, which may be used to manufacture the power semiconductor device according to any one of the above embodiments. FIG. 6 is a flowchart of a manufacturing method of a power semiconductor device according to an embodiment, which includes the following steps.

In S610, a substrate provided with a drift region is acquired.

The drift region is formed on one surface of the substrate, and both the substrate and the drift region are of a first conductivity type. In the present embodiment, the first conductivity type is N-type, and the second conductivity type is P-type. In another embodiment, the first conductivity type is P-type, and the second conductivity type is N-type.

In one embodiment, an N-type epitaxial layer may be extended on a surface of an N-type substrate, serving as a drift region.

In S620, second-conductivity-type ions are doped to form a base region of a second conductivity type in the drift region.

In one embodiment, after photolithography, a P-type base region may be formed in the drift region by aluminum ion implantation by using a photoresist as a mask.

In S630, first-conductivity-type ions are doped to form a first-conductivity-type doping region in the drift region in contact with the base region.

In one embodiment, after the photoresist in step S620 is removed, photolithography may be performed again, and then the first-conductivity-type doping region in contact with the base region is formed in the drift region by nitrogen ion implantation.

In S640, the first-conductivity-type ions are doped to form a source region of the first conductivity type in the base region.

In one embodiment, after the photoresist in step S630 is removed, photolithography may be performed once again, and then the source region of the first conductivity type is formed in the base region by nitrogen ion implantation.

In S650, a contact metal is formed on the first-conductivity-type doping region.

In one embodiment, after the photoresist in step S640 is removed, the contact metal may be deposited, and then photolithography and etching are performed on the contact metal. The etched contact metal should retain enough width, such that the contact metal can extend from the first-conductivity-type doping region and reaches above the base region, but should not be too wide to reach above the source region.

The contact metal forms, with the first-conductivity-type doping region below, a contact barrier having rectification characteristics, which may be, for example, a schottky barrier. The contact metal may be made of metals such as gold, titanium and nickel, which form a barrier having rectification characteristics after contacting with a semiconductor.

In S660, a gate structure is formed on the drift region.

In one embodiment, a gate oxide layer may be grown after the photoresist in step S650 is removed, and then polysilicon is deposited to form a polysilicon gate by photolithography and etching.

In S670, a source metal wrapping the contact metal is formed, and the source metal is in contact with the source region.

In the present embodiment, the metal is deposited after an electrode contact region is etched, then the metal is etched to extract electrodes, and finally passivation treatment is performed. In the present embodiment, the passivation treatment includes forming a passivation layer covering the gate structure. The passivation layer wraps two sides of the gate structure.

In one embodiment, a step of forming a second-conductivity-type; doping region in the drift region may be further included between steps S610 and S620. Specifically, after photolithography, the second-conductivity-type doping region distributed at intervals may be formed in the drift region by aluminum ion implantation by using a photoresist as a mask. The second-conductivity-type doping region is formed below the base region and the first-conductivity-type doping region and is in contact with the base region and the first-conductivity-type doping region.

In one embodiment, a step of forming a body contact region in the base region may be further included between steps S620 and S650. Specifically, after the photoresist is removed, the photolithography is performed again, and a P+ type body contact region may be formed in the base region by aluminum ion implantation. The body contact region is formed between the source region and the first-conductivity-type doping region. In one embodiment, the step of forming a body contact region is between steps S630 and S640.

The above embodiments only describe several implementations of the present application, which are described specifically and in detail, and therefore cannot be construed as a limitation on the patent scope of the present application. It should be pointed out that those of ordinary skill in the art may make various changes and improvements without departing from the ideas of the present application, all of which shall fall within the protection scope of the present application. Therefore, the patent protection scope of the present application shall be subject to the appended claims.

What is claimed is:

1. A power semiconductor device, comprising:
   a substrate of a first conductivity type;
   a drain metal disposed on a first surface of the substrate;
   a drift region of the first conductivity type and disposed on a second surface of the substrate, the second surface being opposite to the first surface;
   a base region of a second conductivity type and disposed in the drift region; the first conductivity type and the second conductivity type being opposite conductivity types;
   a gate structure comprising a gate dielectric layer on the drift region and a gate on the gate dielectric layer, the gate structure extending above the base region;
   a first-conductivity-type doping region in contact with the base region on one side of the base region away from the gate structure;
   a source region of the first conductivity type and disposed in the base region and between the first-conductivity-type doping region and the gate structure;
   a contact metal disposed on the first-conductivity-type doping region and forming a contact barrier having rectification characteristics with the first-conductivity-type doping region below, wherein a dimension of the contact metal in a first direction is greater than a dimension of the first-conductivity-type doping region in the first direction, such that the contact metal extends to a position above the base region next to the first-conductivity-type doping region and not reaching the source region, the first direction being a wiring direction between the gate and the contact metal; and
   a source metal wrapping the contact metal and in contact with the source region.

2. The power semiconductor device according to claim 1, further comprising a body contact region of the second conductivity type disposed in the base region and between the source region and the first-conductivity-type doping region, the contact metal being in contact with the body contact region.

3. The power semiconductor device according to claim 1, further comprising a second-conductivity-type doping region disposed in the drift region, the second-conductivity-type doping region being disposed below the base region and the first-conductivity-type doping region and being in contact with the base region and the first-conductivity-type doping region.

4. The power semiconductor device according to claim 3, wherein the second-conductivity-type doping region consists of a plurality of sub-doping regions distributed at intervals in a second direction, the second direction is perpendicular to the first direction, and a plane formed by the second direction and the first direction is a horizontal plane.

5. The power semiconductor device according to claim 4, wherein the sub-doping regions are of equal size and distributed at equal intervals in the second direction, and a ratio of a dimension of the interval in the second direction to a dimension of the sub-doping regions in the second direction is 0.2-0.6:1.

6. The power semiconductor device according to claim 3, wherein a dimension ratio of a part of the second-conductivity-type doping region below the base region to a part of the second-conductivity-type doping region below the first-conductivity-type doping region in the first direction is 0.2-0.4:1.

7. The power semiconductor device according to claim 1, wherein a doping concentration of the first-conductivity-type doping region is greater than a doping concentration of the drift region and less than a doping concentration of the source region.

8. The power semiconductor device according to claim 1, wherein the contact metal is made of at least one selected from the group consisting of gold, titanium, and nickel.

9. The power semiconductor device according to claim 1, wherein the contact barrier having rectification characteristics is a schottky barrier.

10. The power semiconductor device according to claim 1, wherein the first conductivity type is N-type, and the second conductivity type is P-type.

11. The power semiconductor device according claim 1, wherein the power semiconductor device is a silicon carbide power semiconductor device.

12. A method of manufacturing a power semiconductor device, comprising:
    acquiring a substrate provided with a drift region, the drift region being formed on one surface of the substrate, and the substrate and the drift region being of a first conductivity type;
    doping second-conductivity-type ions to form a base region of a second conductivity type in the drift region; the first conductivity type and the second conductivity type being opposite conductivity types;
    doping first-conductivity-type ions to form a first-conductivity-type doping region in the drift region that is in contact with the base region;
    doping the first-conductivity-type ions to form a source region of the first conductivity type in the base region;
    forming a contact metal on the first-conductivity-type doping region, the contact metal forming a contact barrier having rectification characteristics with the first-conductivity-type doping region below, and the contact metal extending toward the source region and above the base region not reaching the source region;
    forming a gate structure on the drift region, the gate structure comprising a gate dielectric layer on the drift region and a gate on the gate dielectric layer, the gate structure extending above one side of the base region opposite to the first-conductivity-type doping region; and
    forming a source metal wrapping the contact metal, the source metal being in contact with the source region.

13. The method according to claim 12, wherein after the step of acquiring the substrate provided with the drift region and prior to the step of doping second-conductivity-type ions to form the base region of the second conductivity type in the drift region, the method further comprises a step of forming a second-conductivity-type doping region in the drift region, the second-conductivity-type doping region being formed below the base region and the first-conductivity-type doping region and being in contact with the base region and the first-conductivity-type doping region.

14. The method according to claim 12, wherein after the step of doping second-conductivity-type ions to form the base region of the second conductivity type in the drift region and prior to the step of forming the contact metal on the first-conductivity-type doping region, the method further comprises a step of forming a body contact region in the base region, the body contact region being formed between the source region and the first-conductivity-type doping region.

15. The method according to claim 13, wherein the step of forming the second-conductivity-type doping region in the drift region comprises: after photolithography, forming the second-conductivity-type doping region distributed at intervals in the drift region by aluminum ion implantation by using a photoresist as a mask.

16. The method according to claim 12, wherein acquiring the substrate provided with the drift region comprises: extending an N-type epitaxial layer on a surface of an N-type substrate, serving the N-type epitaxial layer as the drift region.

17. The method according to claim 13, wherein doping first-conductivity-type ions to form the first-conductivity-type doping region in the drift region that is in contact with the base region comprises: after the photoresist is removed, performing photolithography again, and then forming the first-conductivity-type doping region in contact with the base region in the drift region by nitrogen ion implantation.

18. The method according to claim 12, wherein the contact metal is made of at least one selected from the group consisting of gold, titanium, and nickel.

19. The method according to claim 12, wherein the contact barrier having rectification characteristics is a schottky barrier.

20. The method according to claim 12, wherein forming the gate structure on the drift region comprises: growing a gate oxide layer after the photoresist is removed, and then depositing polysilicon to form a polysilicon gate by photolithography and etching.

* * * * *